United States Patent [19]

Cohen et al.

[11] 4,191,572
[45] Mar. 4, 1980

[54] PROCESS FOR IMAGE REPRODUCTION USING MULTILAYER PHOTOSENSITIVE ELEMENT WITH SOLVENT-SOLUBLE LAYER

[75] Inventors: Abraham B. Cohen, Springfield; Roxy Ni Fan, East Brunswick, both of N.J.

[73] Assignee: E. I. Du Pont de Nemours and Company, Wilmington, Del.

[21] Appl. No.: 915,062

[22] Filed: Jun. 12, 1978

Related U.S. Application Data

[63] Continuation-in-part of Ser. No. 747,026, Dec. 2, 1976, abandoned, which is a continuation-in-part of Ser. No. 583,455, Jun. 3, 1975, abandoned.

[51] Int. Cl.² ............................................. G03C 5/00
[52] U.S. Cl. .................................. 430/260; 430/293; 430/300
[58] Field of Search ............... 96/28, 35.1, 67, 86 P, 96/87 R, 115 P

[56] References Cited

U.S. PATENT DOCUMENTS

| | | | |
|---|---|---|---|
| 3,359,107 | 12/1967 | Goffe et al. | 96/83 |
| 3,375,112 | 3/1968 | Theodorou | 96/67 |
| 3,615,435 | 10/1971 | Chu et al. | 96/35.1 |
| 3,754,910 | 8/1973 | Kuchta | 96/37 R |
| 3,770,438 | 11/1973 | Celeste | 96/67 |
| 3,884,693 | 5/1975 | Bauer et al. | 96/35.1 |

FOREIGN PATENT DOCUMENTS 7413916 10/1974 Netherlands .

Primary Examiner—Jack P. Brammer

[57] ABSTRACT

An image reproduction process which comprises (1) exposing imagewise to actinic radiation a photosensitive element comprising a cover sheet, a photoadherent layer, and a solvent-soluble, contiguous layer, (2) stripping the cover sheet from the element with either the exposed or unexposed areas of the photoadherent layer adhered to the cover sheet while the other areas of the photoadherent layer remain on the contiguous layer, and (3) washing out the bared areas of the contiguous layer.

19 Claims, 1 Drawing Figure

PROCESS FOR IMAGE REPRODUCTION USING MULTILAYER PHOTOSENSITIVE ELEMENT WITH SOLVENT-SOLUBLE LAYER

CROSS REFERENCE TO PRIOR APPLICATION

This is a continuation-in-part of application Ser. No. 747,026 filed Dec. 2, 1976, now abandoned, which is a continuation-in-part of application Ser. No. 583,455, filed June 3, 1975, now abandoned.

BACKGROUND OF THE INVENTION

1. Field of the Invention

The invention relates to the field of image reproduction with photosensitive elements, particularly those comprising polymeric layers, which are peeled apart in the process of forming images. Such elements are particularly useful for image reproduction and for color proofing and related photomechanical uses, e.g., as lithographic transparencies, photomasks, photoresists, etc.

2. Description of the Prior Art

The prior art describes a variety of photopolymer elements and processes of use, which include producing an image by toning unexposed areas of a photopolymer layer, by image transfer, and producing an image by peeling a photosensitive element apart. In addition, such prior art as U.S. Pat. Nos. 3,469,982 and 3,526,504 describe producing a resist image from an imagewise exposed photopolymerizable or photocrosslinkable layer by washing out the unexposed areas of the layer. The elements of the prior art each have a specific utility and likewise have limitations which limit their usefulness in other applications. For example, in the development of photoresist, the incomplete washing out of the unexposed areas of the photoresist layer may result in a defective printed circuit due to incomplete plating or etching. An element is needed for photoresists, graphic arts and other applications which can produce a polymeric image in the unexposed areas by complete solvent development and which can produce images of colored polymeric material having a high optical density without interfering with the characteristics of the photosensitive element.

SUMMARY OF THE INVENTION

In accordance with this invention an improved image reproduction process comprises:

(1) exposing imagewise to actinic radiation a peel apart photosensitive element comprising, in order, from top to bottom (a) a strippable cover sheet, (b) a photoadherent layer comprising material with ethylenically unsaturated or benzophenone type groups, (c) a nonphotosensitive solvent-soluble, polymeric contiguous layer, and (d) a sheet support, (2) stripping the cover sheet from the element with only the exposed or unexposed areas of the photoadherent layer adhered to the cover sheet while the other areas of said photoadherent layer remain on said contiguous layer without transfer to the cover sheet, and (3) washing out the areas of the contiguous layer from which areas of the photoadherent layer were removed.

BRIEF DESCRIPTION OF THE DRAWINGS

The FIGURE of the drawing shows a preferred embodiment comprising a strippable cover sheet 1, a photoadherent layer 2, a contiguous solvent-soluble layer 3 and a support 4. The areas 5 of the photoadherent layer adhere to and are removed with the cover sheet after imagewise exposure of the element to actinic radiation leaving insoluble areas 6 of the photoadherent layer remaining on the contiguous layer. In a particularly preferred embodiment areas 5 are the exposed areas of the photoadherent layer and areas 6 are the unexposed areas. The areas 7 of the contiguous layer which are between the insoluble remaining areas of the photoadherent layer are then washed out with a solvent in which the areas 7 are soluble and in which areas 6 are insoluble. In the particularly preferred embodiment a duplicate polymeric image is produced.

DESCRIPTION OF THE PREFERRED EMBODIMENT

Figure 1:
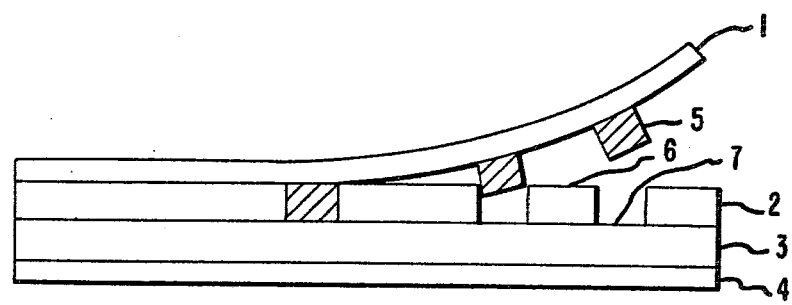

The invention is a versatile photosensitive process whereby a variety of images are produced, most preferably, duplicate polymeric images for use as photoresists and, where the image is colored, as photomasks, transparencies, and the like. The photoadherent layer, which is preferably the sole photosensitive layer of the element, is one whose adhesive relationship between the cover sheet and the contiguous layer is altered by exposure to actinic radiation so that after exposure either the exposed or unexposed areas of the photoadherent layer adhere more strongly to the cover sheet than to the contiguous layer and are removed with the cover sheet leaving the other areas remaining on the contiguous layer. In a particularly preferred embodiment the exposed areas of the photoadherent layer adhere more strongly to the cover sheet after exposure and are removed therewith leaving the unexposed areas of the photoadherent layer remaining on the contiguous layer. The areas of the photoadherent layer remaining on the contiguous layer after stripping off the cover sheet must be insoluble under a condition under which the contiguous layer is soluble so that the areas of the contiguous layer may be washed out imagewise while the remaining areas of the photoadherent layer which are insoluble in the solvent prevent the areas of the contiguous layer underneath them from being washed out. The difference in the solubility of the photoadherent layer and the contiguous layer may exist in the element in its original condition or may be induced by an intermediate treatment such as exposure to actinic radiation, treatment with a reagent, heating, etc. depending on the particular materials of the element. For example, after imagewise exposure and stripping off of the cover sheet, the element may be given an overall exposure to actinic radiation thereby hardening the remaining areas of the photoadherent layer while the contiguous layer remains unaffected since it is nonphotosensitive, thereby rendering the remaining areas of the photoadherent layer insoluble. It is only required that under some condition the areas of the photoadherent layer remaining on the contiguous layer be insoluble in a solvent in which the contiguous layer is soluble.

By "washing out" is meant the removal of material by using a solvent, which may include agitation in a bath of solvent, with the aid of mechanical action such as brushing or spraying. The insoluble property of the remaining areas of the photoadherent layer and the soluble property of the contiguous layer may be due to their respective degrees of photohardening or degree of polymerization or to their respective degrees of absorptivity, hydrophilicity or reactivity with respect to the solvent.

Various solvents suitable for use are disclosed in the prior art. The particular solvent to be used will depend on the materials of which the photoadherent layer and the contiguous layer are composed and the method of use of the element (e.g., whether it is given an overall additional exposure to actinic radiation after stripping the cover sheet). Such hydrocarbon solvents as 1,1,1-trichloroethane, benzene, toluene, and hexane, for example, are known in the art for washing out areas of polymeric layers for image development. In the case of certain polymers, water and dilute aqueous alkali or acid solutions may be used, depending on the particular materials of the element.

The strippable cover sheet of the element of the invention must be strippable (i.e., removable by peeling it apart) from the rest of the element, carrying with it only exposed or unexposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and the polarity increased by a surface treatment such as electrostatic discharge or flame treatment. In the case of a polyethylene terephthalate film having a thickness of 0.0005 inch, an electrostatic discharge treatment of at least 0.025 coul/ft$^2$ and preferably about 0.07 coul/ft$^2$ is suitable. However, increased treatments may be used. Flame treatment of the film also will provide good photoadhesion. An air-propane flame may be used. The cover sheet may additionally undergo auxiliary treatment or bear layers to improve adhesion, strength, and other properties.

While the thickness of the cover sheet may be varied over a wide range, films having a thickness of 0.001 inch or less are particularly preferred. Thin cover sheets produce halftone dots of good roundness with sharp edges. In addition a tonal range of 2%–98% dot resolution (using a halftone screen with 150 lines/inch) and a rapid rate of cover sheet strippability is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment if used will not injure it and so that it may be stripped without tearing.

The photoadherent layer may adhere more strongly to the cover sheet than to the contiguous layer after exposure in either the exposed or unexposed areas. In the latter case, preferably the photoadherent layer is comprised of a material such as that disclosed, in U.S. Pat. No. 3,770,438, or other composition that adheres more strongly to the cover sheet than to the contiguous layer in the unexposed areas and more strongly to the contiguous layer than to the cover sheet in the exposed areas. Preferred photopolymerizable compositions are comprised of a macromolecular organic polymer binder and an addition polymerizable ethylenically unsaturated monomer which is present in excess amount of the absorptive capacity of the binder for the monomer so that a thin layer of substantially free monomer is present on the surface layer of the composition. Preferably the contact angle of the monomer on the cover sheet should be at least 2° greater than the contact angle of the monomer on the contiguous layer. The monomer should be substantially nondiffusible in the contiguous layer.

In the preferred embodiment, the exposed areas of the photoadherent layer adhere more strongly to the cover sheet than to the contiguous layer in the exposed areas and more strongly to the contiguous layer than to the cover sheet in the unexposed areas. In such embodiments, photohardenable materials are preferred for the photoadherent layer. Such materials are usually comprised of a material with ethylenically unsaturated or benzophenone-type groups in which an increase in molecular weight and, consequently, an increase in adherence to the cover sheet are caused by exposure to actinic radiation. The well-known photohardenable materials which are comprised of an ethylenically unsaturated material which is photopolymerizable, photocrosslinkable, photodimerizable or combinations thereof are preferred. Such materials are described, for example, in Chu, et al., U.S. Pat. No. 3,649,268. Particularly preferred are photopolymerizable compositions comprised of a macromolecular organic polymer binder and an addition polymerizable ethylenically unsaturated monomer. The binder may be those disclosed in U.S. Pat. Nos. 3,469,982 and 3,984,244 and is preferably a polar material such as an acidic polymer containing at least 1.5 mole percent free acid groups to impart polarity to the polymer. The monomer has at least one and preferably two or more terminal ethylenically unsaturated groups capable of free radical initiated, chain propagated addition polymerization, said monomer preferably having some degree of polarity and being compatible with the binder and with the polar surface of the cover sheet, but substantially nondiffusible in the contiguous layer. The photopolymerizable composition will also contain a free radical generation addition polymerization photoinitiating system (i.e., at least one organic photoinitiator compound) activatable by actinic radiation, e.g., ultraviolet and visible radiation. Among acidic binders which have been found useful, there may be mentioned co(methyl methacrylate/methacrylic acid) and monoethyl ester of poly(methyl vinyl ether/maleic anhydride), each of which may be compolymerized in various proportions. Many other polar polymers and copolymers known in the art will be found useful as a binder in the photopolymerizable layer. Among the ethylenically unsaturated monomers which have been found useful are those disclosed in Plambeck, U.S. Pat. Nos. 2,760,863; Cohen and Schoenthaler, 3,380,831 and Chambers and Woodward, 3,573,918. Also useful are epoxy monomers containing ethylenic unsaturation of the type disclosed in U.S. Pat. No. 3,661,576 and British Pat. No. 1,006,587. There may be mentioned as examples dipentaerythritol acrylate (50% tetra and 50% penta), pentaerythritol triacrylate and tetraacrylate polypropylene glycol (50) ether of pentaerythritol tetraacrylate, polyethylene glycol (200) dimethyacrylate, dipentaerythritol monohydroxy pentaacrylate, pentaerythritol triacrylate β-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence and the property of insolubility in a solvent for the contiguous layer. Usually the photoadherent layer will be clear, but for some applications a colored layer may be desired.

The free radical generating addition polymerization initiating systems activatable by actinic radiation may be, for example, any of those disclosed in Notley, U.S. Pat. Nos. 2,951,752; Chang and Fan, 3,549,367; Fan, 3,558,322; and Chang, 3,926,643. Other particularly useful initiating systems are disclosed in Cescon et al., U.S. Pat. Nos. 3,615,454; Grub, 3,647,467; Baum et al., 3,652,275; Chang, 3,661,558; and Strilko, 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. Nos. 2,784,183 and Gurney, 3,644,394. Specific compounds which are particularly useful in the photopolymerizable layers of this invention are 2-(stilbyl-4")-(naphtho-1',2':4,5)-1,2,3-triazol-2"-sulfonic acid phenyl ester hereinafter designated as Brightener I and 7-(4'-chloro-6'-diethylamino-1',3',5'-triazine-4'-yl) amino-3-phenylcoumarin hereinafter designated as Brightener II. These compounds are useful in preparing sharp, bright, multicolor images with clean white backgrounds on toning with colorants as shown in U.S. Pat. No. 3,854,950.

While the coating weight of the photoadherent composition may be varied, it has been found that a preferred range from 20–100 mg/dm$^2$ (providing a dry layer thickness of about 0.00006–0.00033 inch) will give good image quality and tonal range.

The contiguous layer may be chosen from a great number of materials that will be soluble at least after imagewise exposure of the element to radiation that is actinic to the photoadherent layer. The contiguous layer is a nonphotosensitive polymeric material which is soluble in conventional solvents. Polymers soluble in aqueous solutions may be used for the contiguous layer where it is desired to use an aqueous solvent for wash out. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible. Particularly preferred materials are elastomeric polymers and mixtures thereof having a second order transition temperature of −10° C. or lower which are inherently tacky or will accept tackifying agents and which are non-migratory into said photoadherent layer and which will impart tackiness to the layer. Rubber type polymers, both natural and synthetic may be used, e.g., polyisobutylene, Thiokol A. nitrile rubbers, butyl rubber, chlorinated rubbers, polymers of butadiene, poly(vinylisobutylether), polyisoprene and random, teleblock and block copolymers of butadiene or isoprene copolymerized with styrene; and neoprene, silicone elastomers, etc., in various proportions. With these materials, a stable adhesion balance between the photoadherent layer and a support for the contiguous layer, in a preferred element, may be achieved for elements useful in making color proofs by the overlay method or by the surprint method. Such elastomeric materials are soluble in hydrocarbon solvents such as hexane. These elastomeric materials are also preferred for their tackiness which provides good adhesion to the photoadherent layer, leading to good separation of the element when the cover sheet is stripped off and providing good adhesion to substrates where the element is laminated to a substrate. This tackiness can also be further improved by the addition of tackifiers such as those described in Skeist, *Handbook of Adhesives*, Ch. 14, Reinhold Publishing Corp., 1962. Such tackifiers may comprise a polyterpene resin, a coumaroneindene resin, stabilized glycerol esters of abietic acid resin, stabilized acid wood rosin, a β-pinene polymer, and a cycloaliphatic resin. Particularly useful are the highly stabilized glycerol ester of abietic acid resin and low molecular weight cycloaliphatic hydrocarbon resins, both types having a softening point of about 85° C. The tackifier apparently associates with the rubber network of the elastomer and expands the volume fraction of the rubber phase, which tends to reduce stiffness and provides aggressive tackiness.

Other preferred materials for contiguous layers that can be washed out according to the invention, are polymeric materials soluble in aqueous solutions, such as polyvinyl alcohol, polyvinyl pyrrolidone, polyvinyl pyrrolidone/vinyl acetate, sodium carboxymethyl cellulose, hydroxy propyl cellulose, polyethylene oxide, and acid or anhydride containing binders such as copolymers of maleic anhydride with styrene, vinyl methyl ether, methyl methacrylate, methacrylic acid, or acrylic acid, etc. Also useful are polymeric materials soluble in hydrocarbon or halogenated hydrocarbon solvents which have a softening temperature above room temperature such as the binders disclosed in U.S. Pat. Nos. 3,469,982 and 3,984,244. In the particular instance where the polymeric material of the contiguous layer and the unexposed photoadherent material are soluble in the same solvent, the unexposed photoadherent material remaining after imagewise exposure and removal of the cover sheet with photoadhered thereon may be insolubilized uniformly exposing to actinic radiation. The contiguous layer may be comprised of the polymer or resin alone or it may contain other additives to improve or modify its properties such as plasticizers, pigments, colorants, fillers, brighteners, etc.

Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch) will be satisfactory. The contiguous layer may also be coated as a dispersion, e.g., an aqueous dispersion with satisfactory results. In a preferred embodiment, which is illustrated in the drawings, the element has a support (4) for the contiguous layer (3). The support (4) may be any suitable film which has the necessary characteristics for the proper adhesion to layer (3) dependent upon how the elemeht is to be used, i.e., for overlay color proofing or for making photomasks, litho negatives, etc., for photomechanical processes. For color proofing by the overlay method, for example, photographic grade polyethylene terephthalate films which may or may not contain an anchoring layer such as those disclosed in Alles, U.S. Pat. No. 2,779,684 may be used. Similar films may or may not having a releasable coating, e.g., a silicone coating, may also be used. A thermoplastic layer may also be used which allows support (4) to be easily stripped from layer (3) yet holds layers (3) and (4) together when heat laminated or delaminated. When using a thermoplastic layer, the stripping operation leaves the thermoplastic layer attached to the contiguous layer (3). A release film that does not require any special treatment is obviously the most convenient.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

The process of the invention is capable of producing either duplicate or reverse images (i.e., either corresponding or complementary images) as desired. Accordingly, with an element as described in copending application Ser. Nos. 747,023 and 747,024 filed Dec. 2, 1976, a polymeric image may be produced by exposing the element, stripping the cover sheet, and washing out with a solvent. The soluble contiguous layer provides a layer in which a high density of colorant may be incorporated if desired without interfering with the photosensitivity or operability of the element and whose composition may be selected to provide good adhesion where the contiguous layer is to be laminated to a separate surface. Alternatively, the photoadherent layer can contain an added colorant, thus producing a duplicate or reverse image on the stripped cover sheet and a complementary image on the contiguous layer.

In using the novel film elements of this invention, the film elements are exposed to image-bearing transparencies, e.g., conventional halftone color separation positives, by means of actinic radiation to which the photoadherent layer is most sensitive, e.g., a carbon arc which is rich in ultraviolet radiation. Other radiation sources which may be used include mercury vapor or pulsed xenon lamps and lasers. To produce duplicate, solvent-developed images the exposed elements are then delaminated generally at room temperature by stripping with a moderate to rapid continuous motion the cover sheet (1) from the element at an angle of generally at least 135° leaving a hardened negative image on the cover sheet and an image of uncovered contiguous layer on the element. The unexposed and insoluble image areas of photoadherent layer (2) remain on contiguous layer (3). The bared areas of the contiguous layer are then washed out with a solvent to give a positive image. To produce reverse, solvent-developed images the exposed elements are then delaminated generally at room temperature by stripping with a continuous motion the cover sheet (1) from the element leaving an unhardened positive image on the cover sheet and an image of uncovered contiguous layer on the element. The exposed and insoluble negative image areas of photoadherent layer (2) remain photoadhered to the contiguous layer (3). The bared areas of the contiguous layer are then washed out with a solvent to give a negative image.

EXAMPLES OF THE INVENTION

The following examples illustrate the invention.

A printed circuit was made on a copper-clad epoxy board in the following manner:

I. PHOTOADHERENT LAYERS: PHOTOPOLYMERIZABLE COATING COMPOSITION

For the photoadherent layer a coating solution of a photopolymerizable composition was prepared by mixing together the following ingredients:

| | |
|---|---|
| Poly(methyl methacrylate/methacrylic acid)(90/10) | 75.0 g. |
| Polyethylene glycol dimethacrylate | 57.5 g. |
| (2-o-Chlorophenyl-4,5-diphenyl imidazolyl) dimer | 3.0 g. |
| Brightener I (described above) | 0.79 g. |
| Brightener II (described above) | 3.55 g. |
| 2,2'-dihydroxy-4-methoxybenzophenone | 0.32 g. |
| 2-mercaptobenzothiazole | 2.0 g. |
| Methyl alcohol | 77.5 g. |
| Methylene chloride | 870.0 g. |

The solution was coated on polyethylene terephthalate film having a thickness of 0.0005 inch which had been surface treated by electrostatic discharge at 0.07 coulomb/ft$^2$. The coating weight was about 43–47 mg/dm$^2$.

II. CONTIGUOUS LAYER: TACKY ELASTOMER COATING COMPOSITION

A coating composition was prepared by mixing together the following ingredients:

| | |
|---|---|
| Cis-polybutadiene | 360.0 g. |
| Random copolymer of styrene/butadiene (40/60) | 240.0 g. |
| Tetra bis[methylene 3-(3',5'-di-t-butyl-4'-hydroxyphenyl) propionate] methane | 3.0 g. |
| Methylene chloride | 5400.0 g. |

The resulting solution was coated on samples of polyethylene terephthalate film having a releasable layer of polydimethyl/siloxane coated thereon to give a coating weight of 100 mg/dm$^2$ and dried to give a layer of cis-polyisobutadiene and polystyrene copolymer in a ratio of 60/40.

III. LAMINATING PROCEDURE

The elements from I and II were laminated in surface to surface relationship of the coated layers at room temperature with a pressure of 40 pounds per square inch.

IV. OPERATIONS FOR CONSTRUCTING A PRINTED CIRCUIT

The releasable layer coated film was stripped from the tacky layer of the element resulting from operation III and the tacky layer surface of the element was laminated at room temperature and a pressure of about 40 pounds per square inch to the surface of a copper clad epoxy board which is conventionally used in the preparation of printed circuits. The copper surface having been degreased and cleaned as is known in the art. The resulting element was exposed through a positive transparency of the desired printed circuit through the clear film cover sheet contiguous with the photopolymerizable layer. The clear film cover sheet was then stripped off at a moderate rate with a continuous motion. The exposed areas photoadhered to the cover sheet leaving an image of the desired circuit covered by unexposed photopolymerizable layer on the tacky layer. The copper clad board with the circuit diagram in the covered tacky layer was immersed in a hexane solution which only dissolved the bared tacky layer leaving the desired copper circuit covered by the tacky layer and unexposed photopolymerizable layer which acted as a resist. The circuit board was then immersed in a conventional ferric chloride etching solution to remove the unwanted copper layer. The remaining photopolymer layer and underlying tacky layer was then removed by methylene chloride to give a good quality printed circuit.

This process is useful in arranging the exposure of a transparency in such a manner that the desired conductive pattern may be formed by plating, chemical milling or other methods of modification as taught by Celeste, U.S. Pat. No. 3,469,982.

For example, the etchable metal surface may be magnesium, zinc, copper, alloys of such metals, aluminum, anodized and dyed anodized aluminum, steel alloys, beryllium-copper alloys, etc.

EXAMPLE 2

An element wherein the photoadherent layer contains a colorant was made as follows:

I. PHOTOADHERENT LAYER: PHOTOPOLYMERIZABLE COATING COMPOSITION

A polyethylene terephthalate photographic grade film, having a thickness of 0.0005 inch and surface treated by exposure to electrostatic discharge (0.07 coulombs/ft$^2$) was coated with the following photopolymerizable composition:

| | |
|---|---|
| Polymethyl methacrylate (Inherent Viscosity: 0.20–0.22 for a solution of 0.25 g. in 50 ml. chloroform, at 20° C., using a No. 50 Cannon-Fenske Viscosimeter) | 17.75 g. |
| Polymethyl methacrylate (Inherent Viscosity: 1.25–1.50 for a solution of 0.25 g. in 50 ml. chloroform at 20° C. using a No. 50 Cannon-Fenske Viscosimeter) | 12.50 g. |
| Polyoxyethylated trimethylol propane triacrylate (10 moles of ethylene oxide) (M.W. 1162) | 32.25 g. |
| Pheneanthrenequinone | 1.25 g. |
| Carbon Black | 36.25 g. |
| Trichloroethylene/methylene chloride (60/40) to make a 12% solids solution | |

The coating weight was 37.8 mg/dm$^2$.

II. CONTIGUOUS LAYER: ELASTOMER COATING COMPOSITION

A coating solution was prepared using a stereospecific polybutadiene (98% cis, 2% trans) rubber. The solution was made up as a 9% concentration in methylene chloride. It was coated on a 0.0025 inch thick polyethylene terephthalate film in an amount of about 80 mg/dm$^2$.

III. LAMINATION PROCEDURE

Elements from I and II were laminated in surface to surface contact of the coated layers at room temperature and about 40 pounds per square inch pressure.

IV. EXPOSURE AND DELAMINATION

The element was exposed to an image transparency by means of an exposing device identified as a "nuArc Plate Maker (Flip-Top)" manufactured by the nuArc Company, Chicago, Illinois. Good photoadhesion was obtained and good images were formed on the treated cover sheet which could be used as a negative-working phototool, i.e., visual aid slides, exposure transparencies, and color proofing, etc. The exposed areas of the photoadherent layer adhered to and were removed with the cover sheet when it was stripped.

The bared areas of the tacky layer could be removed by a suitable solvent which does not affect the unexposed areas of the colored photoadherent layer to provide a product by a positive-working process.

The foregoing two examples represent preferred embodiments of the invention, wherein the exposed areas of the photoadherent layer adhere to and are removed by stripping the cover sheet, the areas of the photoadherent layer which remain on the contiguous layer being insoluble in a solvent in which the contiguous layer is soluble due to the difference in the solubility of the original materials of which these layers are composed. However, the difference in solubility may be effected by an intermediate treatment, e.g., exposure to actinic radiation, in other embodiments. For example, such an exposure of the element, nonimagewise, after stripping the cover sheet could serve to photoharden and thereby insolubilize the remaining areas of the photoadherent layer. As used above and below, therefore, a "soluble" contiguous layer includes contiguous layers which are soluble without an intermediate treatment and also those which are soluble with an intermediate treatment. Likewise, "insoluble" denotes materials which are insoluble or capable of being rendered insoluble. The terms, of course, have reference to the same solvent. In preferred embodiments, no intermediate treatment is required, the difference in solubility existing at least immediately after stripping the cover sheet.

As exemplified above and below, the elements of the invention may be used to form a resist image on a surface by laminating the contiguous layer to the surface. The sheet support on the contiguous layer is removed before laminating. Then the cover sheet is stripped off and areas of the contiguous layer are washed out, leaving a polymeric resist image on the surface. It is desirable that the resist image be easily visible, and a colorant may be therefore contained in the contiguous layer. Since the contiguous layer is not photosensitive, the colorant need not be of any particular type for this purpose.

The resist image may be used in a process of permanently modifying the adjacent areas on the surface which are unprotected by the resist image by using a reagent capable of etching said adjacent areas or depositing a material on (e.g., plating) said adjacent areas. In such a case, wash out of the contiguous layer simultaneously with or in the same medium used for surface modification (e.g., an etching bath) is within the scope of the invention.

EXAMPLE 3

An element was made in the following manner:

I. NONTONABLE PHOTOADHERENT LAYER—ALTERNATE TYPE

An alternate type of photoadherent layer which adheres to the cover sheet only in the unexposed areas was made from a photosensitive composition prepared with the following ingredients:

| | |
|---|---|
| Polymethyl methacrylate (Inherent Viscosity 0.20–0.22 for a solution of 0.25 g. in 50 mls. chloroform, at 20° C. using a No. 50 Cannon-Fenske Viscosimeter) | 1.55 g. |
| Chlorinated rubber (Parlon$^O$ S-5 by Hercules Powder Company) (67% chlorinated - 20% solution in toluene at 25° C. has a viscosity of 4–7 centipoise) | 21.0 g. |
| Pentaerythritol triacrylate | 20.0 g. |
| 2-Tertiary butyl anthraquinone | 2.1 g. |
| Triethylene glycol acetate | 2.35 g. |
| 2,2'-Methylene-bis-(4-ethyl-6-t-butylphenol) | 2.35 g. |
| Victoria Pure Blue (CI 44045) dye | 0.50 g. |
| Methylene chloride | 200.0 g. |

The ingredients were thoroughly mixed and coated using a 0.002-inch doctor knife on a 0.001-inch transparent polyethylene terephthalate base allowed to dry.

II. CONTIGUOUS LAYER: TACKY ELASTOMER COATING COMPOSITION

A coating composition was prepared by mixing together the following ingredients:

| | |
|---|---|
| Cis-polybutadiene (Raw Mooney Typical Viscosity 40) | 360.0 g. |
| Random copolymer of styrene/butadiene (40/60) (Raw Mooney Typical Viscosity 34) | 240.0 g. |
| Tetra bis[methylene 3-(3',5'-di-t-butyl-4'-hydroxyphenyl) propionate] methane | 3.0 g. |
| Methylene chloride | 5400.0 g. |

The resulting solution was coated on 0.0025 inch thick polyethylene terephthalate film to give a dry coating weight of 100 mg/dm$^2$.

III. LAMINATION PROCEDURE

The photoadherent layer (I) and the contiguous layer (II) were laminated together in surface to surface relationship under pressure at 40 pounds per square inch at room temperature.

IV. EXPOSURE, IMAGING AND DEVELOPING PROCEDURE

The laminated elements resulting from Step III were exposed through halftone color separation transparencies (next to the cover sheet) by means of a pulsed Xenon lamp (nuArc Flip-Top Model 17 ampere) for 2 minutes. Five minutes after exposure, the elements were delaminated by peeling the 0.001 inch polyethylene terephthalate cover sheet at an angle of at least 135 degrees and a rate of about 9,000 inches/minute. The unexposed areas of the blue photopolymerizable layer adhered to the 0.001 inch polyethylene terephthalate cover sheet and were removed with the said cover sheet as a positive working image. The complementary exposed blue image areas remained on the contiguous layer, and the bared areas of the contiguous layer are washed out with n-hexane to provide a polymeric reverse image on the 0.0025 inch thick polyethylene terephthalate film.

EXAMPLE 4

An aqueous developable element was made as follows:

I. PHOTOADHERENT LAYER: PHOTOPOLYMERIZABLE COATING COMPOSITION

A polyethylene terephthalate film having a thickness of 0.001 inch and surface treated by exposure to electrostatic discharge (0.07 coulombs/ft$^2$) was coated with the following photopolymerizable composition:

| | |
|---|---|
| Polymethyl methacrylate (M.W. ~ 40,000) | 20.0 g. |
| Trimethylolpropane trimethacrylate | 15.0 g. |
| 2-o-Chlorophenyl-4,5-diphenyl imidazolyl) dimer | 1.0 g. |
| Brightener I (described above) | 0.7 g. |
| Brightener II (described above) | 0.3 g. |
| 2,2'-Dihydroxy-4-methoxybenzophenone | 0.6 g. |
| 2-Mercaptobenzothiazole | 0.6 g. |
| Polyoxyethylene lauryl ether | 3.0 g. |
| Methylene chloride | 800.0 g. |

II. CONTIGUOUS LAYER

A water soluble contiguous layer coating composition was made from the following components:

| | |
|---|---|
| Polyvinyl pyrrolidone (20% solution) | 13.0 g. |
| Polyvinyl alcohol (10% solution) | 5.0 g. |
| Carbon black | 25.0 g. |
| Isooctyl phenyl polyethoxy ethanol | 5.0 ml. |
| Water | 40.0 gm. |

This composition was coated on a polyethylene terephthalate film having a gelatin sublayer.

III. LAMINATION PROCEDURE

Elements from I and II were laminated in surface to surface contact of the coated layers at 50° C.

IV. EXPOSURE AND DELAMINATION

The element was exposed to an image transparency for 30 seconds with a xenon arc. The 0.001 inch thick electrostatic discharge treated polyethylene terephthalate cover sheet was stripped and the exposed areas of the photopolymerizable layer adhered thereto. The element was then given an overall nonimagewise exposure to actinic radiation to harden the remaining areas of the photopolymerizable layer. The bared areas of the black contiguous layer were washed out with cold water, leaving a black image with an optical density of about 3.5. The image bearing element produced would be useful as a positive working litho film. Such litho films possess an optical density in the contiguous layer of at least 3.0 and preferably 4.0.

EXAMPLE 5

A printed circuit was made on a copper-clad epoxy board in the following manner:

I. PHOTOADHERENT LAYERS: PHOTOPOLYMERIZABLE COATING COMPOSITION

For the photoadherent layer a coating solution of a photopolymerizable composition is prepared by mixing together the following ingredients:

| | |
|---|---|
| Poly(methyl methacrylate/methacrylic acid) (90/10) (MW ~60,000) | 14.4 g. |
| Poly(methyl methacrylate/methacrylic acid) (98.5/1.5) (MW ~30,000) | 14.4 g. |
| Tetraethylene glycol dimethacrylate | 15.7 g. |
| (2-o-Chlorophenyl-4,5-diphenyl imidazolyl) dimer | 1.65 g. |
| Brightener I (described above) | 0.40 g. |
| Brightener II (described above) | 1.95 g. |
| 2,2'-dihydroxy-4-methoxybenzophenone | 0.15 g. |
| Polyethylene oxide (MW ~4,000,000) | 0.38 g. |
| 2-mercaptobenzothiazole | 0.75 g. |
| Methyl alcohol | 13.5 g. |
| Methylene chloride | 40.0 g. |

The solution is coated on polyethylene terephthalate film having a thickness of 0.0005 inch which has been surface treated by electrostatic discharge at 0.07 coulomb/ft$^2$. The coating weight is about 30 mg/dm$^2$.

II. CONTIGUOUS LAYER

A coating composition is prepared by mixing together the following ingredients:

| | |
|---|---|
| Poly(methyl methacrylate/methacrylic acid) (98.5/1.5) (MW ~30,000) | 37.6 g. |
| Polymethylmethacrylate (intrinsic viscosity 1.2) | 12.5 g. |
| Pentaerythritol triacrylate | 38.1 g. |
| Triethylene glycol diacetate | 5.4 g. |
| Tert-butyl anthraquinone | 5.4 g. |
| 2,2'-methylene bis(4-ethyl-6-tert-butyl-phenol) | 0.7 g. |
| Victoria Pure Blue B.O. (CI 42595) | 0.3 g. |
| Lacer Wax (pentaerythritol ester of fatty acids derived from grape seed oil) | 6.0 g. |
| Methylene Chloride | 530. g. |

The resulting solution is coated on a sample of polyethylene terephthalate film having a releasable layer of polydimethyl/siloxane coated thereon to give a coating weight of 230 mg/dm$^2$. The coating did not retain toner.

III. OPERATIONS FOR CONSTRUCTING A PRINTED CIRCUIT

The contiguous layer surface of element (II) was laminated at 110° C. and a pressure of about 40 pounds per square inch to the surface of a copper clad epoxy board which is conventionally used in the preparation of printed circuits. The copper surface has been degreased and cleaned as is known in the art. The film with the releasable layer is stripped from the contiguous layer which is then laminated in surface to surface contact with the coated layer of element (I) at 104° C. with a pressure of 40 pounds per square inch.

The resulting element is exposed through a positive transparency of the desired printed circuit through the clear film cover sheet contiguous with the photopolymerizable layer. The clear film cover sheet is then stripped off at a moderate rate with a continuous motion. The exposed areas photoadheres to the cover sheet leaving unexposed image areas of the desired circuit on the blue-dyed contiguous layer. The uncovered areas of the contiguous layer are developed by wiping with a cotton pad soaked with methyl chloroform to give a light blue circuit image on the copper board. The circuit board is then immersed in a conventional ferric chloride etching solution to remove the unwanted copper layer. The remaining photopolymer layer and underlying contiguous layer are then removed by methylene chloride to give a good quality printed circuit.

EXAMPLE 6

An element wherein the photoadherent layer contains a colorant is made as follows:

I. PHOTOADHERENT LAYER: PHOTOPOLYMERIZABLE COATING COMPOSITION

A polyethylene terephthalate photographic grade film, having a thickness of 0.0005 inch and surface treated by exposure to electrostatic discharge (0.07 coulombs/ft$^2$) is coated with the following photopolymerizable composition:

| Component | Amount (g.) |
|---|---|
| (a) Methylene chloride solvent | 780.0 |
| (b) Methanol solvent | 9.9 |
| (c) 2-ethoxyethanol solvent | 5.0 |
| (d) Terpolymer formed from 56% ethylacrylate, 37% methyl methacrylate and 7% acrylic acid, M.W. ca. 260,000, acid number 76-85 | 10.5 |
| (e) 1:1 copolymer of styrene and maleic anhydride, partially esterified with isopropyl alcohol, M.W. ca. 1700, acid number ca. 270 | 6.0 |
| (f) Triethylene glycol dimethacrylate | 5.0 |
| (g) Trimethylol propane triacrylate | 0.68 |
| (h) 2,2'-bis(2-chlorophenyl)-4,4',5,5'-tetraphenyl biimidazole | 3.4 |
| (i) Michler's Ketone | 1.8 |
| (j) colloidal carbon | 7.0 |

In preparing the above coating formulation component (j) is first mixed separately with an equal quantity of component (d) and sand milled to obtain a small particle size. The dry coating weight of the coated formulation is 49.1 mg/dm$^2$.

II. CONTIGUOUS LAYER

A 1% by weight ethanol solution of hydroxypropyl cellulose (M.W. ca. 1,000,000) is coated onto a 0.0025 inch thick polyethylene terephthalate film and is dried to give a dry coating weight of 10 mg/dm$^2$.

III. LAMINATION PROCEDURE

Elements from I and II are laminated in surface to surface contact of the coated layers at about 82° C. and about 40 pounds per square inch pressure.

IV. EXPOSURE AND DELAMINATION

The element is exposed to an image transparency by means of an exposing device identified as a "nuArc Plate Maker (Flip-Top)" manufactured by the nuArc Company, Chicago, Illinois. Good photoadhesion is obtained and good images are formed on the treated cover sheet which could be used as a negative-working phototool, i.e., visual aid slides, exposure transparencies, and color proofing, etc. The exposed areas of the photoadherent layer adhered to and are removed with the cover sheet when it is stripped.

The bared areas of the contiguous layer can be removed by a suitable solvent, e.g., by gentle rubbing with a pad saturated with water at room temperature, which does not affect the unexposed colored photopolymerizable layer to reproduce the image transparency by a positive working process.

EXAMPLE 7

An element wherein the photoadherent layer contains a colorant is made as in Example 6 except that the contiguous layer is prepared by coating a 20% by weight methylene chloride solution of poly(vinylpyrrolidone/vinyl acetate) (60/40) on a 0.0025 inch polyethylene terephthalate film to give a dry coating weight of 93.6 mg/dm$^2$ and by laminating elements I and II at room temperature. After imagewise exposure as described in Example 6, good photoadhesion to the cover sheet is obtained to form negative images thereon after removal from the element. The uncovered areas of the contiguous layer are removed by washing with water to give a positive reproduction of the image transparency.

EXAMPLE 8

An aqueous developable element is made as follows:

I. PHOTOADHERENT LAYER: PHOTOPOLYMERIZABLE COATING COMPOSITION

A polyethylene terephthalate film having a thickness of 0.001 inch and surface treated by exposure to electrostatic discharge (0.07 coulombs/ft$^2$) is coated with the following photopolymerizable composition:

| Component | Amount (g.) |
|---|---|
| Methylene chloride solvent | 1375.0 |
| Methanol solvent | 130.0 |
| Trichloroethylene solvent | 2795.0 |
| Poly(methyl methacrylate/methacrylic acid) (90/10) (MW 30,000–50,000) | 369.0 |
| Poly(ethylene oxide) (MW ca. 1,000,000) | 2.5 |
| Tetraethylene glycol dimethacrylate | 141.5 |
| 2,2'-bis(2-chlorophenyl)-4,4',5,5'-tetraphenyl biimidazole | 14.75 |
| Brightener I (described above) | 3.85 |
| Brightener II (described above) | 17.15 |
| 2,2'-dihydroxy-4-methoxybenzophenone | 1.35 |
| 2-mercaptobenzothiazole | 9.85 |

II. CONTIGUOUS LAYER

| Component | Amount (g.) |
|---|---|
| Methylene chloride solvent | 2733.0 |
| 2-ethoxy ethanol solvent | 229.0 |
| 1:1 copolymer of styrene and maleic anhydride, partially esterified with isopropyl alcohol, MW ca. 1700, acid number ca. 270 | 123.0 |
| Polyethylene oxide | 1.2 |
| Triethylene glycol dimethacrylate | 82.0 |
| Lacer Wax (pentaerythritol ester of fatty acids derived from grape seed oil) | 144.0 |
| Fluocarbon surfactant FC-430 (a product of 3M Co.) | 0.25 |
| 2,2'-methylene bis(4-ethyl-6-tert-butyl phenol) | 0.06 |
| Carbon black | 180.0 |

This composition is coated on resin subbed 0.005 inch polyethylene terephthalate film wherein the resin sub is alkali soluble.

III. LAMINATE PROCEDURE

Elements from I and II are laminated in surface to surface contact of the coated layers at 50° C.

IV. EXPOSURE AND DELAMINATION

The element is exposed to an image transparency for 30 seconds with a xenon arc. The 0.001 inch thick electrostatic discharge treated polyethylene terephthalate cover sheet is stripped and the exposed areas of the photopolymerizable layer adhere thereto. The element is then washed with an alkaline sodium carbonate/bicarbonate solution to remove the uncovered areas of the contiguous layer to produce a black positive image of the image transparency.

EXAMPLE 9

A printed circuit is made on a copper-clad epoxy board in the following manner:

I. PHOTOADHERENT LAYERS: PHOTOPOLYMERIZABLE COATING COMPOSITION

For the photoadherent layer a coating solution of a photopolymerizable composition is prepared by mixing together the following ingredients:

| | |
|---|---|
| Chlorinated rubber (Parlon ® S-5 by Hercules Powder Company) (67% chlorinated - 20% solution in toluene at 25° C. has a viscosity of 4–7 centipoise) | 22.0 g |
| Pentaerythritol triacrylate | 15.0 g |
| 2-Tertiary butyl anthraquinone | 2.0 g |
| 2,2'-Methylene -bis-(4-ethyl-6-t-butylphenol) | 2.0 g |
| Methyl chloroform | 444.0 g |

The solution is coated on polyethylene terephthalate film having a thickness of 0.001 inch to give a dry coating weight of about 42 mg/dm$^2$.

II. CONTIGUOUS LAYER

A coating composition is prepared by mixing together the following ingredients:

| | |
|---|---|
| Poly (methylmethacrylate/methacrylic acid) (98.5/1.5) | 37.6 g |
| Poly methylmethacrylate (intrinsic viscosity 1.2) | 12.5 g |
| Pentaerythritol triacrylate | 38.1 g |
| Triethyleneglycol diacetate | 5.4 g |
| Tert-butyl anthraquinone | 5.4 g |
| 2,2'-Methylene-bis-(4-ethyl-6-t-butylphenol) | 0.7 g |
| Victoria Pure Blue B.O. (C.I. 42595) | 0.3 g |
| Lacer Wax (pentaerythritol ester of fatty acids derived from grape seed oil) | 6.0 g |
| Methylene chloride | 530.0 g |

The resulting solution is coated on a sample of polyethylene terephthalate film having a releasable layer a polydimethyl/siloxane coated thereon to give a coating weight of 230 mg/dm$^2$. The coating does not retain toner.

III. OPERATIONS FOR CONSTRUCTING A PRINTED CIRCUIT

The contiguous layer surface of element II is laminated at 110° C. and a pressure of about 40 pounds per square inch at 2 ft./minute to the surface of a copper clad epoxy board which is conventionally used in the preparation of printed circuits. The copper surface has been degreased and cleaned as is known in the art. The film with the releasable layer is stripped from the contiguous layer which is then laminated in surface to surface contact with the coated layer of element (I) at 104° C. with a pressure of 40 lbs. per square inch at 6 ft./minute.

The resulting element is exposed through a negative transparency of the desired printed circuit through the clear film cover sheet contiguous with the photopolymerizable layer. The clear film cover sheet is then stripped off at a moderate rate with a continuous motion. The unexposed areas adhere to the cover sheet leaving an exposed image of the circuit pattern photoadhered to the blue contiguous layer. A light blue positive image is developed on the board by wiping with a cotton pad soaked with methyl chloroform which removes the uncovered areas of the contiguous layer.

The circuit board is then immersed in a conventional ferric chloride etching solution to remove the unwanted copper layer. The remaining photopolymer layer and underlying contiguous layer is then removed by methylene chloride to give a good quality printed circuit.

This process is useful in arranging the exposure of a transparency in such a manner that the desired conductive pattern may be formed by plating, chemical milling or other methods of modification as taught by Celeste, U.S. Pat. No. 3,469,982.

For example, the etchable metal surface may be magnesium, zinc, copper, alloys of such metals, aluminum, anodized and dyed anodized aluminum, steel alloys, berylliumcopper alloys, etc.

EXAMPLE 10

An element wherein the solvent soluble contiguous layer contains a colorant is made as follows:

I. PHOTOADHERENT LAYER: PHOTOPOLYMERIZABLE COATING COMPOSITION

A coating solution prepared as in part (I) of Example 9 was coated on polyethylene terephthalate film having a thickness of 0.001 inch to give a dry coating weight of about 52 mg/dm².

II. CONTIGUOUS LAYER: COLORED SOLVENT SOLUBLE LAYER

A coating composition was prepared by mixing together the following ingredients:

| | |
|---|---|
| 1:1 copolymer of methyl vinyl ether and maleic anhydride, partially esterified with ethanol, acid No ca. 285 | 20.0 g |
| Brilliant Green Crystal (CI42040) (1% Methylene Chloride Solar) | 1.0 ml |
| Methylene Chloride | 80.0 g |
| Methanol | 5.0 g |
| Ethanol | 20.0 g |

The resulting solution is coated on polyethylene terephthalate film having a thickness of 0.001 inch to give a dry coating weight of about 113 mg/dm².

III. LAMINATION PROCEDURE

The photoadherent layer (I) and the contiguous layer (II) are laminated together in surface to surface relationship under pressure at 40 pounds per square inch at room temperature.

IV. EXPOSURE, IMAGING PROCEDURE

The laminated element resulting from Step III is exposed through halftone color separation transparency (next to the cover sheet) by means of a pulsed Xenon lamp (nu Arc Flip-Top Model 17 ampere) for 4 minutes. The polyethylene terephthalate cover sheet is stripped from the imaged photoadherent layer. The unexposed areas of the clear photoadherent layer adhere to the cover sheet and are removed therewith. The complementary exposed image areas photoadhere to the green contiguous layer. The bared areas of the contiguous layer are removed by wiping with a cotton pad soaked with 0.1 N sodium carbonate solution. After wiping with a water soaked pad the element is dried. The green image resulting is a negative of the original transparency.

By repeating this process with appropriate colored contiguous layers, a high density overlay color proof can be obtained using elements of the above type wherein the optical density of the colorant in the contiguous layer can be increased substantially, as desired, e.g., an optical density of at least 3.0, preferably 4.0 without substantially changing the characteristics of the photoadherent layer. Thus, exposure and stripping characteristics of the element will be substantially the same regardless of the colorant or density used in the contiguous layer.

EXAMPLE 11

An element wherein the photoadherent layer contains a colorant is made as follows:

I. PHOTOADHERENT LAYER: COLORED PHOTOPOLYMERIZABLE COMPOSITION

A photoadherent layer which adheres to the cover sheet only in the unexposed areas is made from photosensitive composition prepared with the following ingredients:

| | |
|---|---|
| Polymethyl methacrylate (Inherent Viscosity 0.20–0.22 for a solution of 0.25 g. in 50 mls. chloroform, at 20° C. using a No. 50 Cannon-Fenske Viscosimeter) | 1.55 g |
| Chlorinated rubber (Parlon® S-5 by Hercules Powder Company) 67% chlorinated-20% solution in toluene at 25° C. has a viscosity of 4–7 centipoise | 21.0 g |
| Pentaerythritol triacrylate | 20.0 g |
| 2-Tertiary butyl anthraquinone | 2.1 g |
| Triethylene glycol acetate | 2.35 g |
| 2,2'-Methylene-bis-(4-ethyl-6-t-butylphenol) | 2.35 g |
| Victoria Pure Blue (CI 44045) dye | 0.50 g |
| Methylene chloride | 200.0 g |

The ingredients are thoroughly mixed and coated using a 0.002-inch doctor knife on a 0.001-inch transparent polyethylene terephthalate base allowed to dry.

II. CONTIGUOUS LAYER: SOLVENT SOLUBLE, NON-TONABLE LAYER

A solvent soluble, non-tonable layer is prepared as in part II of Example 10 except that the coating composition contains no colorant.

III. LAMINATION PROCEDURE

The same procedure as that of part III of Example 10 is used.

IV. EXPOSURE, DELAMINATION AND WASH OUT PROCEDURE

The laminated element resulting from step III is exposed through a halftone color separation transparency (next to the cover sheet) by means of a pulsed Xenon lamp (nu Arc Flip-Top Model 17 ampere) for 2 minutes. Five minutes after exposure, the element is delaminated by stripping the polyethylene terephthalate cover sheet from the imaged photoadherent layer. The unexposed areas of the blue photopolymerizable layer adhere to the cover sheet and are removed therewith to form a positive image (a blue duplicate) of the color separation transparency. The complementary exposed blue image areas photoadhere to the contiguous layer to give a negative or reverse image of the color separation transparency. The bared areas of the contiguous layer are removed as in part IV of Example 2 thereby removing any background stain due to the colorant of the removed unexposed areas. By repeating the process with appropriate colored photopolymer layers, an overlay color proof free of stain can be obtained using the above element.

EXAMPLE 12

A high density litho negative is prepared using the following procedures:

I. PHOTOADHERENT LAYER

A photopolymerizable composition is prepared and coated on 0.001 inch-thick polyethylene terephthalate film as described in Example VIII of U.S. Pat. No. 3,770,438.

II. CONTIGUOUS LAYER

A water soluble contiguous layer coating composition is made from the following components:

| | |
|---|---|
| Polyvinyl pyrrolidone (20% solution) | 13.0 g |
| Polyvinyl alcohol (10% solution) | 5.0 g |
| Carbon black | 25.0 g |
| Isooctyl phenyl polyethoxy ethanol | 5.0 ml |
| Water | 40.0 gm |

This composition is coated on a polyethylene terephthalate film having a gelatin sublayer.

III. LAMINATION PROCEDURE

Elements from I and II are laminated in surface to surface contact of the coated layers at room temperature with a pressure of 40 pounds per square inch.

IV. EXPOSURE, DELAMINATION AND WASH OUT PROCEDURE

The laminated element resulting from Step III is exposed for 90 seconds through a contact litho positive (next to the cover sheet contiguous to the photoadherent layer) to a carbon arc in an exposing device identified as a "nuArc Plate Maker". The polyethylene terephthalate cover sheet is stripped and the unexposed areas of the photopolymerizable layer adhere thereto to give a low density (~0.35) duplicate of the contact positive. The bared areas of the black contiguous layer are washed out with cold water, leaving a black reverse negative image of the contact positive with an optical density above 3.0 and free of pinhole defects. The resulting image can be used as a contact litho negative.

Examples 3 & 9 to 12 represent preferred embodiments of the invention, wherein the unexposed areas of the photoadherent layer adhere to and are removed by stripping the cover sheet, the exposed areas of the photoadherent layer which remain on the contiguous layer being insoluble in a solvent in which the contiguous layer is soluble due to the difference in the solubility of the original materials of which these layers are composed. However, the difference in solubility may be increased by an intermediate treatment, e.g., additional exposure to actinic radiation, in other embodiments. For example, such an exposure of the element, nonimagewise, after stripping the cover sheet could serve to further photoharden the remaining areas of the photoadherent layer and simultaneously solublize the bared areas of the contiguous layer if it is composed of photosoluble material.

We claim:
1. An image reproduction process comprising
   (1) exposing imagewise to actinic radiation a peel apart photosensitive element consisting essentially of, in order, from top to bottom (a) a strippable cover sheet, (b) a photoadherent layer comprising material with ethylenically unsaturated or benzophenone type groups, (c) a nonphotosensitive solvent soluble, polymeric contiguous layer, and (d) optionally an auxiliary layer, and (e) a sheet support,
   (2) stripping the cover sheet from the element with only the exposed or unexposed areas of the photoadherent layer adhered to the cover sheet while the other areas of said photoadherent layer remain on said contiguous layer without transfer to the cover sheet leaving an image of uncovered contiguous layer on the element, and
   (3) washing out the uncovered areas of the contiguous layer from which areas of the photoadherent layer were removed.

2. A process according to claim 1 wherein said cover sheet is a polymeric film which is transparent to actinic radiation and is surface treated by electrostatic discharge or flame treatment, and, after imagewise exposure of said element to actinic radiation, the exposed areas of said photoadherent layer have greater adhesion to said cover sheet than to said contiguous layer and the unexposed areas of said photoadherent layer have greater adhesion to said contiguous layer than to said cover sheet.

3. A process according to claim 1 wherein the sheet support is removed from the contiguous layer of the element, the contiguous layer of the element is laminated to a surface forming a resist on the surface, the cover sheet is stripped and the areas of the contiguous layer are washed out.

4. A process according to claim 3 which comprises permanently modifying the adjacent areas on said surface which are unprotected by the resist image formed by washing out areas of the contiguous layer by using a reagent capable of etching said adjacent areas or depositing a material on said adjacent areas.

5. A process according to claim 1 wherein the contiguous layer of said element contains an added colorant.

6. A process according to claim 5 wherein said colored contiguous layer has an optical density of at least 3.0.

7. A process according to claim 1 wherein the photoadherent layer of said element contains an added colorant.

8. A process according to claim 1 wherein said cover sheet is a polymeric film which is transparent to actinic radiation, and, after imagewise exposure of said element to actinic radiation, the unexposed areas of said photoadherent layer have greater adhesion to said cover sheet than to said contiguous layer and the exposed areas of said photoadherent layer have greater adhesion to said contiguous layer than to said cover sheet.

9. A process according to claim 1 wherein the element contains an auxiliary layer interposed between the contiguous layer (c) and the sheet support (e).

10. A process according to claim 9 wherein the auxiliary layer is a release layer.

11. A process according to claim 9 wherein the auxiliary layer is an anchoring layer.

12. A process according to claim 9 wherein the auxiliary layer is thermoplastic.

13. A process according to claim 1 wherein the sheet support (e) is transparent.

14. A process according to claim 1 wherein the sheet support (e) is a polymeric film.

15. A process according to claim 1 wherein the sheet support (e) contains an added colorant.

16. A process according to claim 15 wherein the colored sheet support has an optical density of at least 3.0.

17. A process according to claim 1 wherein after step (2) the stripped element is uniformly exposed to actinic radiation.

18. A process according to claim 10 wherein the sheet support and auxiliary layer are removed from the contiguous layer of the element, the contiguous layer of the element is laminated to a surface forming a resist on the surface, the cover sheet is stripped and the areas of the contiguous layer are washed out.

19. A process according to claim 18 which comprises permanently modifying the adjacent areas on said surface which are unprotected by the resist image formed by washing out areas of the contiguous layer by using a reagent capable of etching said adjacent areas or depositing a material on said adjacent areas.

* * * * *